(12) United States Patent
Hsu (10) Patent No.: US 6,624,043 B2
(45) Date of Patent: Sep. 23, 2003

(54) METAL GATE CMOS AND METHOD OF MANUFACTURING THE SAME

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 46 days.

(21) Appl. No.: 09/963,080

(22) Filed: Sep. 24, 2001

(65) Prior Publication Data

US 2003/0060018 A1 Mar. 27, 2003

(51) Int. Cl.[7] .............................................. H01L 21/76
(52) U.S. Cl. .................... 438/424; 438/199; 438/218; 438/221; 438/222; 438/294; 438/301
(58) Field of Search ................................ 438/424, 218, 438/221, 222, 294, 301, 763, 778, 199, 585, 926

(56) References Cited

U.S. PATENT DOCUMENTS

| | | | | |
|---|---|---|---|---|
| 5,656,519 A | * | 8/1997 | Mogami | 438/291 |
| 5,856,225 A | * | 1/1999 | Lee et al. | 438/291 |
| 5,858,843 A | * | 1/1999 | Doyle et al. | 438/299 |
| 6,133,106 A | * | 10/2000 | Evans et al. | 438/299 |
| 6,200,866 B1 | | 3/2001 | Ma et al. | 438/299 |

* cited by examiner

Primary Examiner—Matthew Smith
Assistant Examiner—Belur Keshavan
(74) Attorney, Agent, or Firm—David C. Ripma; Matthew D. Rabdau; Scott C. Krieger

(57) ABSTRACT

A metal gate complementary metal oxide semiconductor (CMOS) and a method of manufacturing the same is disclosed. The method includes depositing the metal gate electrode material as a final step before metallization of the device. Accordingly, the metal gate material is not subject to contamination during the fabrication process. The device is fabricated without the use of oxide spacers so that the finished device does not suffer from silicon faceting at the active silicon-to-shallow-trench-isolation-interface. Moreover, the dummy gate material is used to define planarization stops that allow precise planarization of the device during fabrication.

7 Claims, 6 Drawing Sheets

METAL GATE CMOS AND METHOD OF MANUFACTURING THE SAME

FIELD OF THE INVENTION

This invention relates to a metal gate complementary metal oxide semiconductor (CMOS) and a method of manufacturing the same, and, more particularly, to a robust metal gate CMOS having no silicon facet at the active silicon to shallow trench isolation (STI) interface, and a method of fabricating such a device.

BACKGROUND OF THE INVENTION

Conventional metal gate complementary metal oxide semiconductor (CMOS) devices are processed using multiple fabrication steps such as, for example, nitride deposition and etching steps, oxide deposition and etching steps, and planarization steps. With each additional step of the process, the overall yield of the process is potentially decreased. Accordingly, there is a need to reduce the number of required processing steps in order to improve the yield of the overall fabrication process.

U.S. Pat. No. 6,200,866 B1 to Ma et al. discloses a process of using silicon germanium and other alloys as the replacement gate for the fabrication of a metal oxide semiconductor field effect transistor (MOSFET). The method discloses the steps of depositing a silicon germanium layer over the source, drain and gate regions. The silicon germanium over the source and drain regions is then etched to leave a silicon germanium island in the gate region, with exposed source and drain regions. The source and drain regions are then fabricated by a doping process or the like. Oxide spacers are then formed around the gate island, a polysilicon layer deposited over the source, drain and gate regions, and then chemical mechanical polishing is conducted to planarize the device. The dummy gate material is then removed and the gate dielectric and gate electrode materials are deposited.

Figure 12:
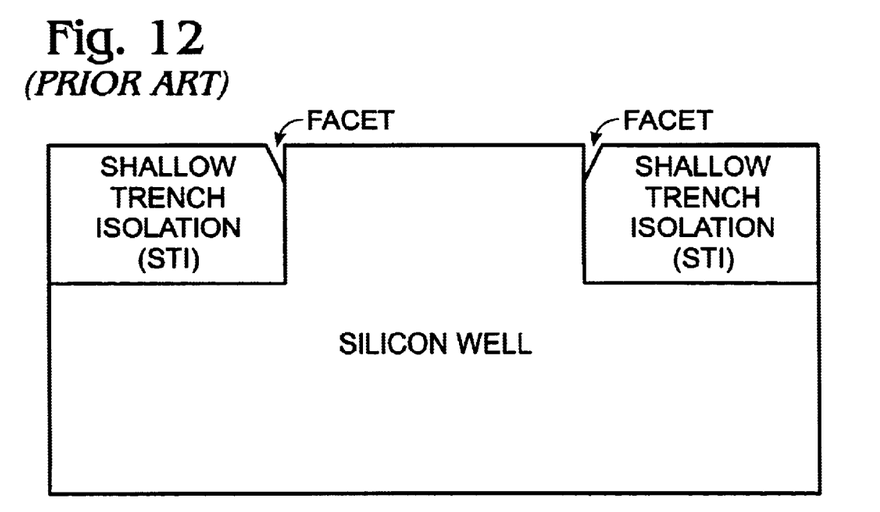
FIG. 12 is a schematic of a prior art device showing faceting at the interface between the active region and the shallow trench isolation.

Due to the formation of the shallow trench isolation early in the process, throughout the subsequent oxide/nitride pad etching process steps, the resulting device typically will include some silicon faceting at the active silicon to shallow trench isolation interface. In particular, as shown in FIG. 12, the silicon faceting comprises a wedge shaped gap in the shallow trench region, directly adjacent to the active region of the device. This silicon faceting often results in a corner transition effect that renders the device unreliable.

Accordingly, there is a need for a device that has reduced silicon faceting at the active silicon-to-shallow-trench-isolation-interface and that has reduced corner transition effects. Moreover, there is a need for a device fabrication process that has a reduced number of steps so as to potentially improve the overall yield of the process.

SUMMARY OF THE INVENTION

The present invention provides a robust metal gate CMOS having no silicon facet at the active silicon to shallow trench insolation (STI) interface. The device is manufactured by a process that is more simple than prior art fabrication processes because the present invention eliminates a nitride etch step, an oxide etch step and an oxidation process step from a known fabrication process. The process also provides self-aligned planarization stops to provide for better planarization of the device. The fabricated device, having no silicon facet at the active silicon to STI interface, provides a more reliable gate oxide and eliminates the corner transition effect.

Accordingly, an object of the invention is to provide a simpler and more robust metal gate CMOS device and a method of fabricating the same.

Another object of the invention is to provide a method that eliminates a nitride etch step, an oxide etch step, and an oxidation process step from a previously known process.

A further object of the invention is to provide a device having better planarization capabilities and no silicon facet at the active silicon to STI interface area.

Yet a further object of the invention is to provide a device that includes a more reliable gate oxide that reduces or eliminates the corner transistor effect.

DETAILED DESCRIPTION OF THE PREFERRED EMBODIMENTS

Figure 1:
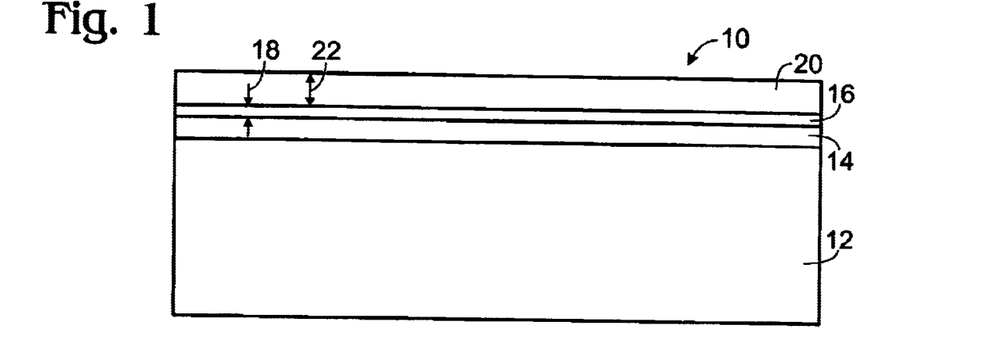
FIG. 1 is a schematic of the device after deposition of a first nitride layer.

Turning now to the drawings, FIG. 1 is a schematic of the device after deposition of a first nitride layer. In the following process example, a mid-gap metal is used as an example. Accordingly, undoped silicon is grown prior to the deposition of the oxide and the first nitride layer. In particular, the process is as follows. Device 10 is fabricated by providing a substrate 12 wherein the substrate may include a silicon wafer as known in the art. An undoped silicon layer 14 is deposited on substrate 12. An oxide layer 16 is then deposited on silicon layer 14. Oxide layer 16 typically has a thickness 18 of approximately 2 nm to 20 nm. A first nitride layer 20 is then deposited on oxide layer 16. Nitride layer 20 typically has a thickness 22 of approximately 100 nm to 200 nm. The layers may be deposited by any known means, such as chemical vapor deposition or the like, as is well known in the art.

Figure 2:
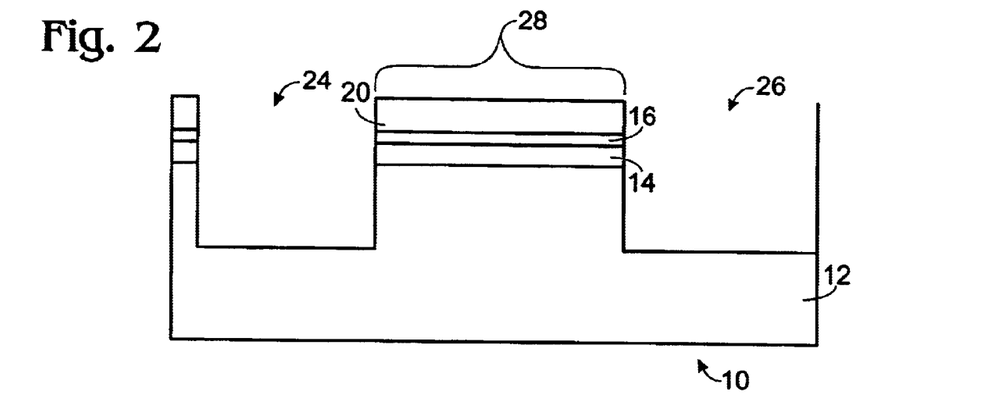
FIG. 2 is a schematic of the device after shallow trench etching.

FIG. 2 is a schematic of the device after shallow trench etching. Photoresist is applied to the device of FIG. 1 to form shallow trench isolation regions 24 and 26 by etching of the silicon, the oxide and the nitride layers in the trench regions.

In a preferred method step, the etch is conducted to a depth of approximately 400 nm to 1000 nm into the silicon of substrate 12. The etch may be conducted by any etch process as known in the art. The photoresist is then removed to leave an island region 28, also called an active region, that will later be formed into a gate region, a source region and a drain region. Accordingly, at this stage of the process, the gate region is not isolated from the source and drain regions. In other words, at this stage of the process the source and the drain are not individually exposed or formed by doping or the like.

Figure 3:
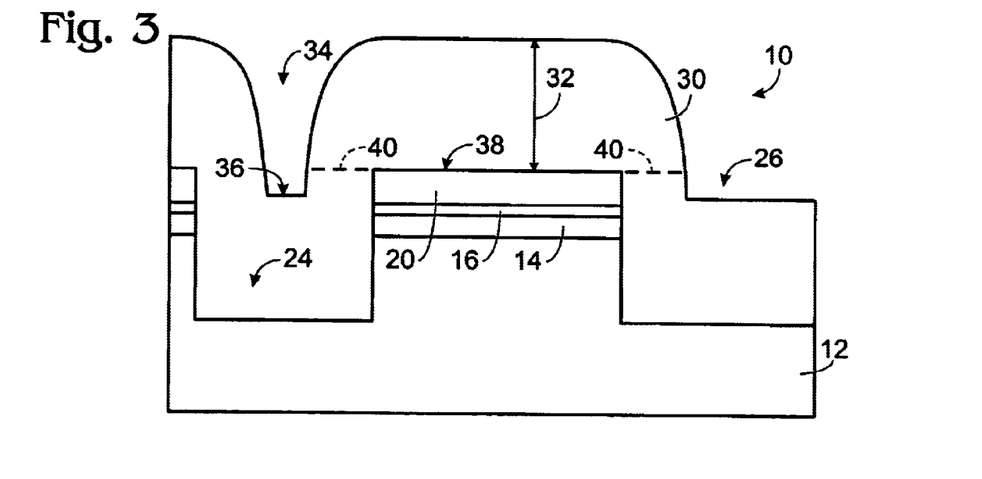
FIG. 3 is a schematic of the device after deposition of an oxide layer.

FIG. 3 is a schematic of the device after deposition of an oxide layer. In particular, the etch damage is cleaned by any well known process and then an oxide layer 30 consisting of 2 nm to 10 nm of thermal oxide and a thick deposited oxide is deposited on the device of FIG. 2. The oxide layer is deposited to a depth so as to fill shallow trench isolation (STI) regions 24 and 26 and so as to cover island region 28. The thickness 32 of oxide layer 30 typically is approximately 400 nm to 1000 nm, which preferably is approximately the same dimension as the depth of trench regions 24 and 26. The oxide layer may be deposited by any method known in the art. Oxide layer 30 typically is deposited so as to form a cavity area 34 in shallow trench region 24. Cavity area 34 typically has a lower surface 36 that is positioned closer to substrate 12, i.e., lower, than the top most surface 38 of first nitride layer 20. This allows a second nitride layer to be deposited within cavity 34 of region 24 and within region 26 to a depth that is below the plane 40 defined by the top most surface 38 of the first nitride layer.

Figure 4:
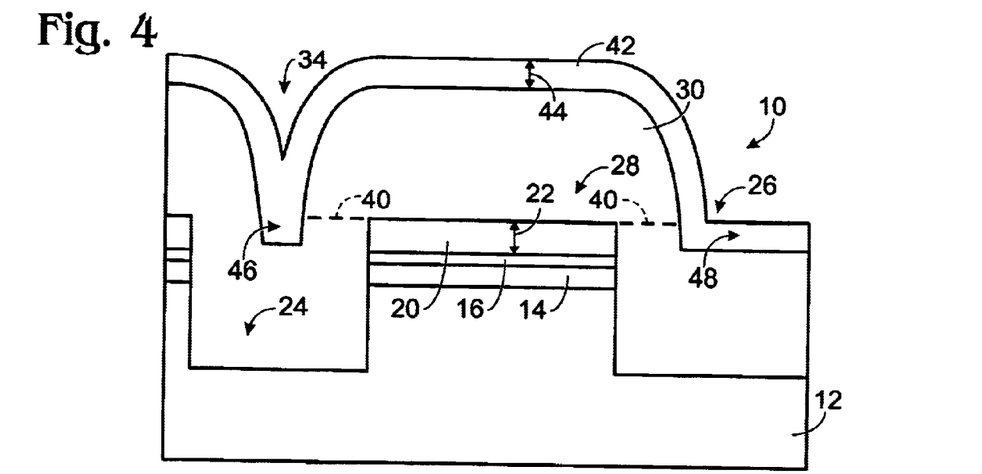
FIG. 4 is a schematic of the device after deposition of a second nitride layer.

FIG. 4 is a schematic of the device after deposition of a second nitride layer. A second nitride layer 42 is deposited on the device of FIG. 4 to a thickness 44 that preferably is the same as or slightly less than the thickness 22 of first nitride layer 20. In particular, second nitride layer typically fills cavity 34 and STI region 26 to a depth that is higher than plane 40.

Still referring to FIG. 4, the nitride material deposited in cavity 34 of region 24 and in region 26 may be referred to as planarization stops 46 and 48, respectively, because nitride material typically can be polished more slowly than oxide material. In other words, placement of the planarization stops 46 and 48 on opposite sides of active region 28 will act as a brake to the polishing step so as to provide acurate and level planarization of active region 28. In other words, the top surfaces of stop 46, active region 28 and stop 48 are aligned to define plane 40 such that the planarization step is preferably stopped upon polishing the surface to expose plane 40.

Figure 5:
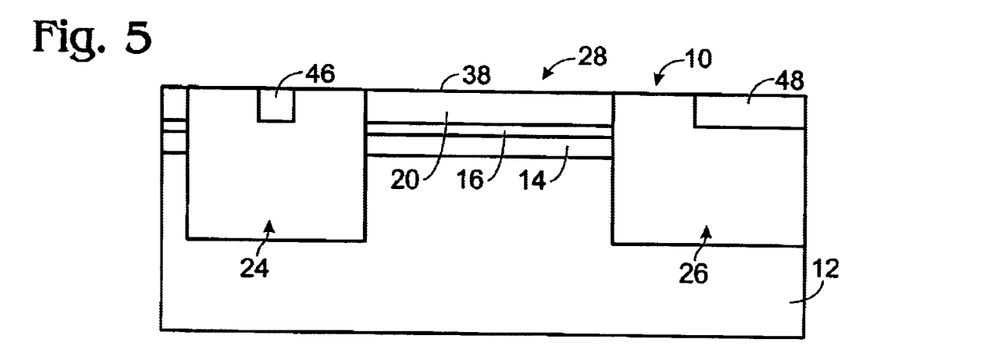
FIG. 5 is a schematic of the device after planarization of the device, showing the deposited planarization stops.

FIG. 5 is a schematic of the device after planarization, showing the deposited planarization stops. In particular, the device of FIG. 4 is subjected to a planarization step, such as a chemical mechanical polishing (CMP) step, to planarize the device. The planarization step typically polishes out the second nitride layer 42 and the oxide layer 30 on the surface of the active area 28 and in STI regions 24 and 26. Planarization stops 46 and 48 ensure that active region 28 is evenly polished. Accordingly, the device shown in FIG. 5 comprises an exposed nitride material in regions 24 and 26 and in active region 28. As stated above, the entire active region 28 is coated with nitride 20, including the gate region, the source region and the drain region. Moreover, the doped source and drain regions, at this stage of the process, have not yet been formed.

Figure 6:
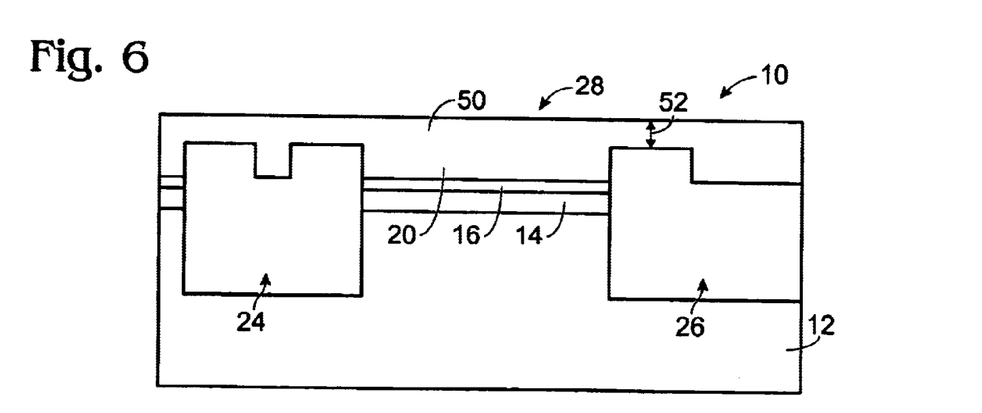
FIG. 6 is a schematic of the device after deposition of a third nitride layer.

FIG. 6 is a schematic of device 10 after deposition of a third nitride layer. In particular, a third nitride layer 50 is deposited on the device of FIG. 5 to a thickness 52 of approximately 50 nm to 200 nm. In active region 28, the third nitride layer is deposited directly on top of first nitride layer 20 such that the height of the overall nitride layer in active region 28 extends above the height of the oxide material in shallow trench regions 24 and 26. At this stage in the process, the source and drain regions have still not been exposed or formed.

Figure 7A:
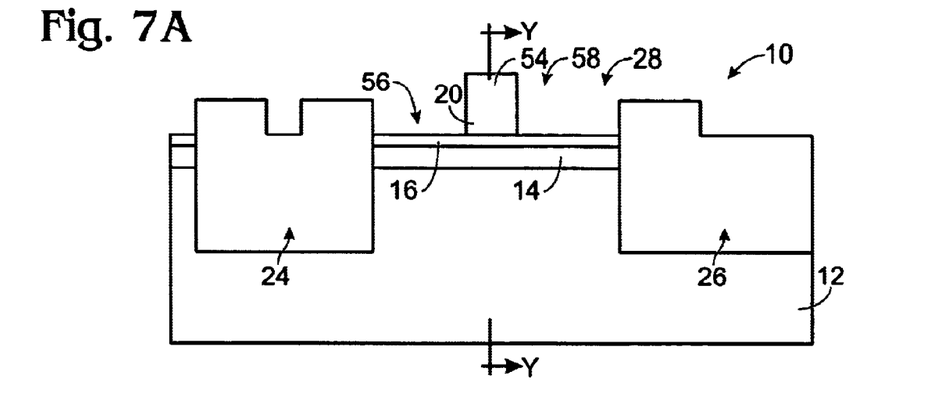
FIGS. 7A–B are schematics of the device after etching of the nitride layers to leave a dummy gate island.
Figure 7B:
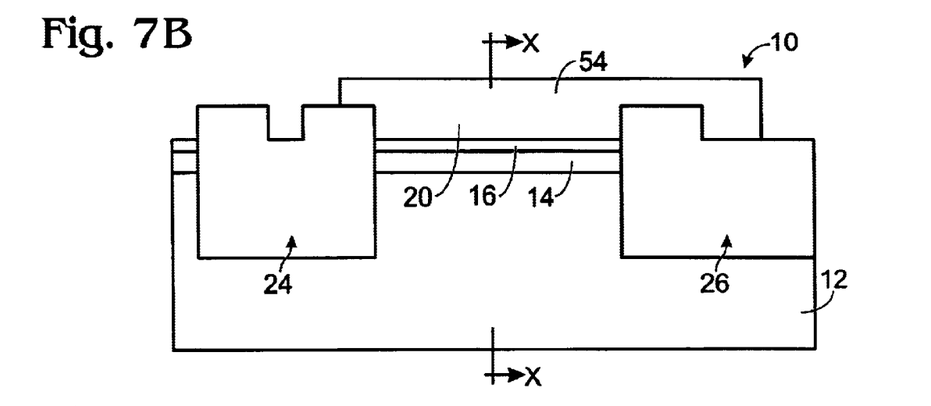

FIGS. 7A–B are schematics of the device after etching of the nitride layers to leave a dummy gate island. Photoresist is first used to protect the gate electrode region 54, which is a small portion of active region 28. The nitride layers are then etched to leave gate electrode region 54 as a freestanding island. Island 54 is a dummy gate, or sacrificial gate, in that the material will eventually be removed and replaced with the final gate material. FIG. 7A shows a cross sectional view showing the newly exposed source region 56, the gate region 54, and the newly exposed drain region 58. This view may be referred to as the "X" cross sectional view. FIG. 7B shows a cross sectional view through the gate electrode 54, which may be referred to as the "Y" cross sectional view. In these figures the shape of the shallow trench isolation (STI) regions look the same in each direction. In other embodiments, the STI regions may have different shapes in the different views.

Figure 8:
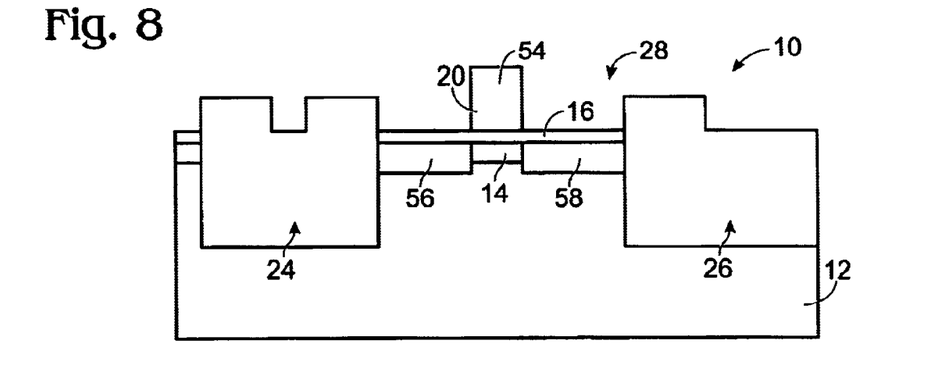
FIG. 8 is a schematic of the device after formation of the source and drain regions.

FIG. 8 is a schematic of the device after formation of the source and drain regions. Source and drain regions 56 and 58, respectively, are formed by ion implantation or any known source and drain formation procedure, such as lightly doped drain implantation (LDD) and N+ or P+ ion implantation. Until this step in the process, the source and the drain areas of the device had not yet been formed. Accordingly, these regions are not subject to contamination during earlier steps of the process. FIG. 8 is a view along the "X" cross section. Although not shown in FIG. 8, dummy gate island 54 may include oxide spacers there around.

Figure 9A:
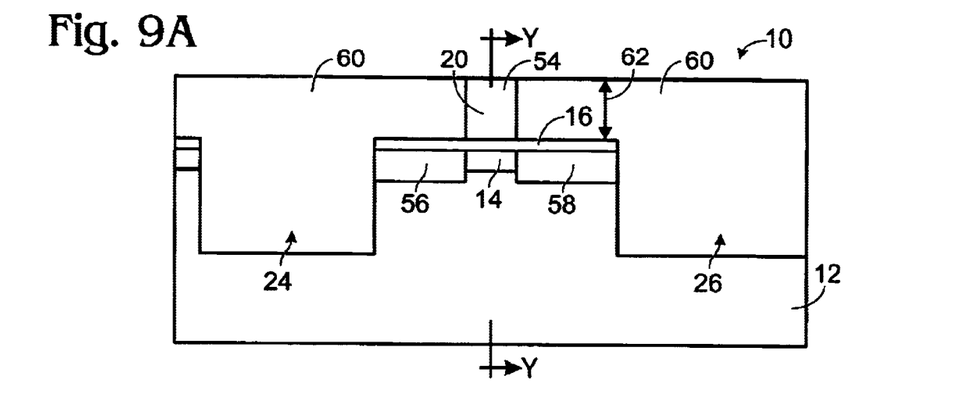
FIGS. 9A–B are schematics of the device after deposition of an oxide layer.
Figure 9B:
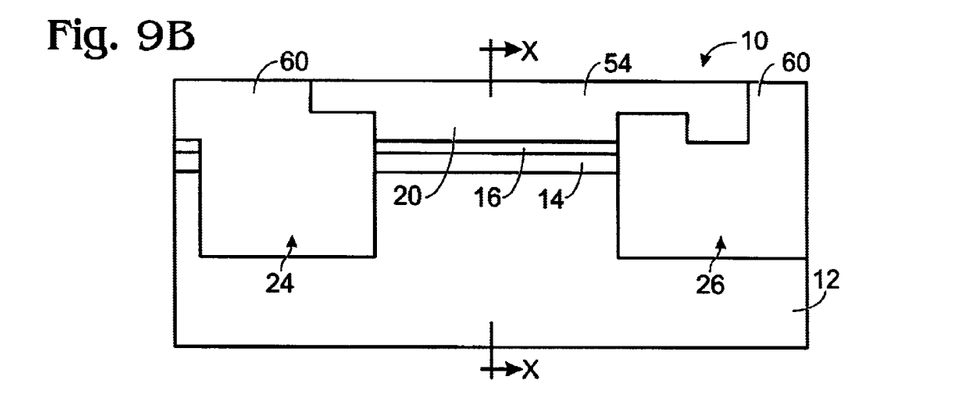

FIGS. 9A–B are schematics of the device after deposition of an oxide layer. In particular, an oxide layer 60 having a thickness that is approximately two times the sum of the thickness of the first nitride layer 20 and the third nitride layer 50 (shown in FIG. 6), is deposited on the device of FIG. 8. Oxide layer 60 is then subjected to planarization, such as by chemical mechanical polishing (CMP), so that the oxide layer has a thickness 62 equal to that of the height of dummy gate 54. After CMP, the top surface of the nitride replacement gate electrode 54 is exposed on the wafer surface. FIG. 9A shows the "X" cross sectional view whereas FIG. 9B shows the "Y" cross sectional view of the device.

Figure 10A:
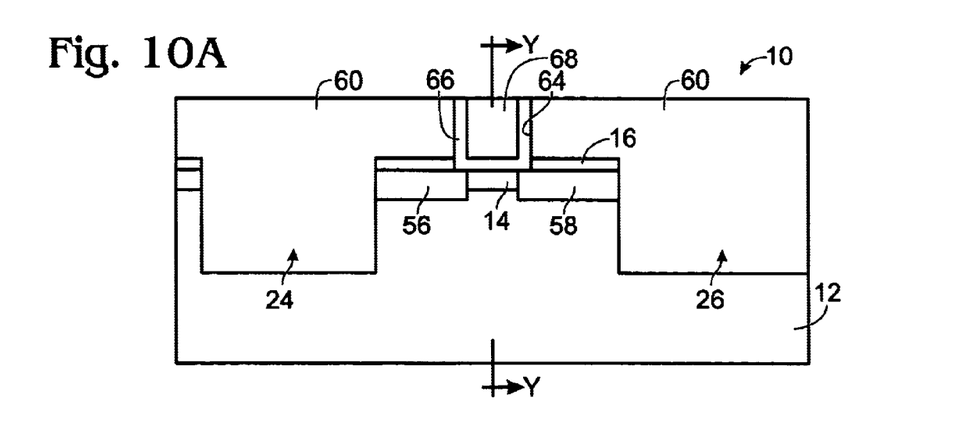
FIGS. 10A–B are schematics of the device after removal of the dummy gate and deposition of the gate dielectric and gate electrode materials.
Figure 10B:
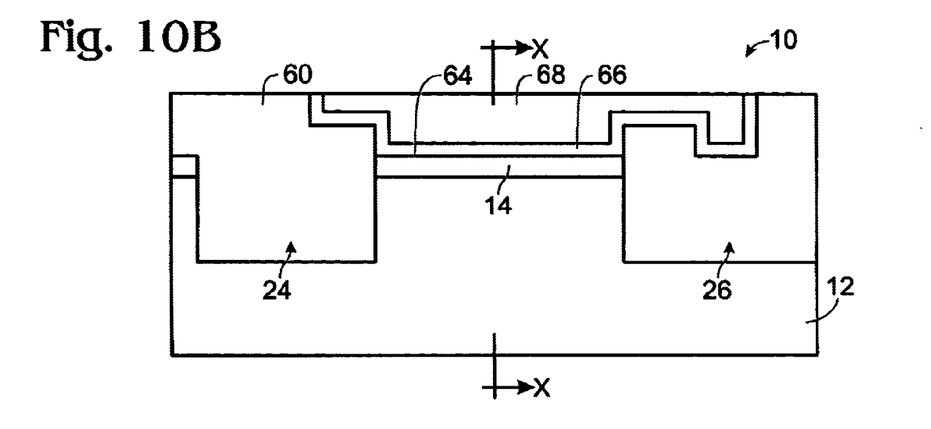

FIGS. 10A–B are schematics of the device after removal of the dummy gate and the dummy gate oxide, and deposition of the gate dielectric and gate electrode materials. In particular, the nitride dummy gate 54 (shown in FIG. 9A) preferably is removed by using hot phosphoric acid. The oxide 16 (shown in FIG. 9A) under the nitride dummy gate 54 in the active area is removed by a BHF etch process. The replacement nitride gate area then becomes a gate trench 64. A thin layer of high-K dielectric material 66 is then deposited on the bottom and side surfaces of trench 64 by any known method, such as by a sputtering or a CVD process. The thickness of high-k dielectric material layer 66 depends on the technology node in which the device will be utilized. The high-k dielectric typically is coated on the sidewalls and the bottom surface of the gate trench, as well as on the top exposed surface of oxide 60. After deposition of the high-k dielectric, a metal gate electrode material 68 is deposited in trench 64 on the dielectric material. The gate dielectric material may include tantalum oxide ($Ta_2O_5$), titanium oxide ($TiO_2$) zirconium oxide ($ZrO_2$), lanthanum oxide ($La_2O_3$), hafnium oxide ($HfO_2$) yttrium oxide ($Y_2O_3$), and their silicates, and other such materials. The gate electrode material may comprise any suitable material known in the art, such as titanium nitride (TiN), tungsten nitride (WN), tantalum nitride (TaN), Copper (Cu), Aluminum (Al), and the like. The metal on the surface of the wafer is then removed by a CMP process. In the preferred embodiment, the gate trench is completely filled with metal, as shown in FIGS. 10A–B. However, in other embodiments the gate trench need not be completely filled with metal. FIGS. 10A and 10B show the structure along the "X" cross-sectional view and along the "Y" cross-sectional view, respectively. Those skilled in the art will understand that layers 16 and 60 are both oxide layers which are shown as distinguished from one another merely for ease of illustration.

Up until this point in the process, the gate electrode material has not been deposited. The gate material, therefore, is not contaminated by the previously conducted steps of the device fabrication process. Moreover, by forming the gate trench near the end of the fabrication process, and by the absence of a step wherein polysilicon is deposited adjacent to the gate island, oxide spaces are not required. Accordingly, the process of the present invention eliminates several process steps from the method of the prior art. This increases the overall yield of the inventive process and produces a device that is more robust.

Figure 11A:
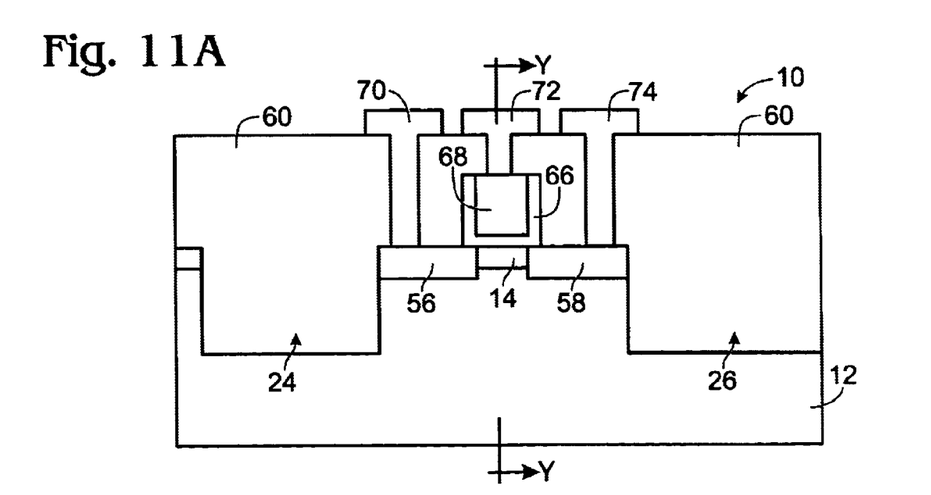
FIGS. 11A–B are schematics of the final device including metallization of the device.
Figure 11B:
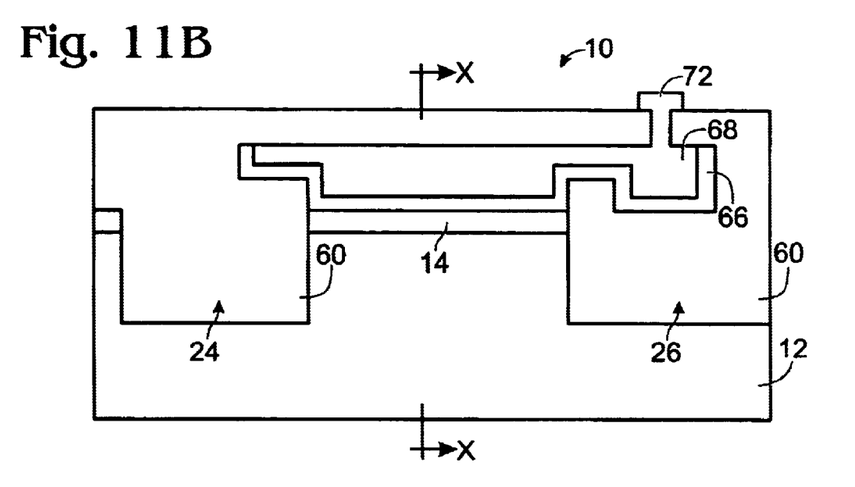

FIGS. 11A–B are schematics of the final device including metallization of the device. In particular, source 56, gate 68 and drain 58 each include a metal contact 70, 72, and 74, respectively. The oxide passivation and metallization process steps to deposit contacts 70, 72 and 74 can be accomplished using any state-of-the-art process, as will be understood by those skilled in the art. FIG. 11A and FIG. 11B show the "X" cross-sectional view and the "Y" cross-sectional view, respectively, of the transistor after completion of metallization process.

As shown in FIGS. 3 through 6, because part of the dummy gate is deposited prior to STI formation, the inventive process does not create a facet at the active area adjacent to the shallow trench. Accordingly, the device produced by the process of the present invention does not suffer from the corner transition effect and is more reliable than prior art devices. Therefore, there is no edge transistor effect and the leakage current of transistor 10 is minimized.

In another embodiment of the method, the first, second and third nitride layers of the above described process can be replaced with polysilicon, without altering other details of the fabrication process.

Thus, a metal gate complementary metal oxide semiconductor (CMOS) and a method of manufacturing the same, is disclosed. More particularly, a robust metal gate CMOS having no silicon facet at the active silicon to shallow trench isolation (STI) interface, and a method of fabricating such a device, is disclosed. Although preferred structures and methods of fabricating the device have been disclosed, it should be appreciated that further variations and modifications may be made thereto without departing from the scope of the invention as defined in the appended claims.

I claim:

1. A method of fabricating a semiconductor device, comprising the steps of:
providing a substrate including an active region having a sacrificial gate island, a source region and a drain region positioned therein;
maintaining said sacrificial gate island free from an oxide spacer while fabricating a source device in said source region; and
maintaining said sacrificial gate island free from an oxide spacer while fabricating a drain device in said drain region;
wherein said step of providing a substrate including an active region having a sacrificial gate island, a source region and a drain region positioned therein, comprises:
providing a silicon substrate including an active region and a shallow trench region;
depositing a silicon layer on said substrate in said active region and in said shallow trench region;
depositing an oxide layer on said silicon layer in said active region and in said shallow trench region;
depositing a sacrificial gate material layer on said oxide layer in said active region and in said shallow trench region;
etching said silicon layer, said oxide layer and said sacrificial gate material in said shallow trench region to form a shallow trench around said active region;
depositing an oxide layer in said shallow trench and in said active region; and
planarizing said device to expose said active region.

2. A method of fabricating a semiconductor device, comprising the sequentially ordered steps of:
providing a silicon substrate that includes an active region and a shallow trench that surrounds said active region, wherein said active region includes a source region, a gate region and a drain region;
depositing a dummy gate material on said substrate throughout said active region;
depositing an oxide layer in said shallow trench;
etching said dummy gate material in said source region and said drain region to define a dummy gate island;
maintaining said dummy gate island free from an oxide spacer while fabricating a source device in said source region;
maintaining said dummy gate island free from an oxide spacer while fabricating a drain device in said drain region;
depositing an oxide layer on said source device and on said drain device;
removing said dummy gate island to form a gate trench; and
depositing a gate material in said gate trench to define a gate;
wherein said step of depositing an oxide layer in said shallow trench comprises depositing an oxide layer throughout said active region and in said shallow trench, and further comprising the step of planarizing said oxide layer in said shallow trench and throughout said active region to expose said dummy gate material in said active region.

3. The method of claim 2 further comprising the steps of:
depositing a final oxide layer throughout said active region;
fabricating a source contact pad through said final oxide layer to said source device;
fabricating a gate contact pad through said final oxide layer to said gate; and
fabricating a drain contact pad through said final oxide layer to said drain device.

4. The method of claim 2, prior to depositing a gate material in said gate trench to define a gate, further comprising the step of depositing a dielectric material in said gate trench.

5. The method of claim 2, prior to etching said dummy gate material in said source region and said drain region to define a dummy gate island, further comprising the steps of depositing a first dummy gate material stop and a second dummy gate material stop, wherein said first stop and said second stop are positioned opposite one another across said dummy gate island, and wherein said step of planarizing said oxide layer in said shallow trench and throughout said active region to expose said dummy gate material in said active region is conducted until said dummy gate and said first and second stops are each exposed.

6. A semiconductor device fabricated by the method of:
providing a substrate including an active region having a sacrificial gate island, a source region and a drain region positioned therein;
maintaining said sacrificial gate island free from an oxide spacer while fabricating a source device in said source region; and
maintaining said sacrificial gate island free from an oxide spacer while fabricating a drain device in said drain region;
wherein said semiconductor device is fabricated with an absence of silicon faceting at an interface between said active region and a shallow trench.

7. A semiconductor device fabricated by the method of:
providing a substrate including an active region having a sacrificial gate island, a source region and a drain region positioned therein;
maintaining said sacrificial gate island free from an oxide spacer while fabricating a source device in said source region; and
maintaining said sacrificial gate island free from an oxide spacer while fabricating a drain device in said drain region;
wherein said step of providing a substrate including an active region having a sacrificial gate island, a source region and a drain region positioned therein, comprises:
providing a silicon substrate including an active region and a shallow trench region;
depositing a silicon layer on said substrate in said active region and in said shallow trench region;
depositing an oxide layer on said silicon layer in said active region and in said shallow trench region;
depositing a sacrificial gate material layer on said oxide layer in said active region and in said shallow trench region;
etching said silicon layer, said oxide layer and said sacrificial gate material in said shallow trench region to form a shallow trench around said active region;
depositing an oxide layer in said shallow trench and in said active region; and
planarizing said device to expose said active region.

* * * * *